(12) United States Patent
Pierson et al.

(10) Patent No.: US 6,774,315 B1
(45) Date of Patent: Aug. 10, 2004

(54) FLOATING INTERPOSER

(75) Inventors: Mark Vincent Pierson, Binghamton, NY (US); Jennifer Rebecca Sweterlitsch, Vestal, NY (US); Charles Gerard Woychik, Vestal, NY (US); Thurston Bryce Youngs, Jr., Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/577,457

(22) Filed: May 24, 2000

(51) Int. Cl.$^7$ .......................... H01R 12/14; H01L 23/50
(52) U.S. Cl. ........................................ 174/261; 257/774
(58) Field of Search ................................ 257/774, 773, 257/778, 678; 361/771, 750, 767, 768, 769; 438/86, 91, 108, 117; 174/260–266; 439/591, 586, 592, 596

(56) References Cited

U.S. PATENT DOCUMENTS

| | | | | |
|---|---|---|---|---|
| 4,330,165 A | * | 5/1982 | Sado ........................... 439/91 |
| 4,927,369 A | * | 5/1990 | Grabbe et al. ................. 439/66 |
| 4,937,707 A | | 6/1990 | McBride et al. ............. 361/398 |
| 4,954,878 A | * | 9/1990 | Fox et al. ..................... 257/675 |
| 5,065,227 A | | 11/1991 | Frankeny et al. ............. 357/74 |
| 5,071,359 A | * | 12/1991 | Arnio et al. ................... 439/91 |
| 5,248,262 A | * | 9/1993 | Busacco et al. ............. 439/493 |
| 5,275,330 A | * | 1/1994 | Isaacs et al. ........... 228/180.21 |
| 5,362,656 A | | 11/1994 | McMahon .................... 437/21 |
| 5,386,341 A | | 1/1995 | Olson et al. ................. 361/749 |
| 5,403,194 A | * | 4/1995 | Yamazaki .................... 439/66 |
| 5,517,754 A | | 5/1996 | Beilstein, Jr. et al. ......... 29/480 |
| 5,530,288 A | | 6/1996 | Stone .......................... 257/700 |
| 5,531,022 A | * | 7/1996 | Beaman et al. ............... 29/848 |
| 5,553,769 A | | 9/1996 | Ellerson et al. ............. 228/123 |
| 5,567,654 A | | 10/1996 | Beilstein, Jr. et al. ...... 437/209 |
| 5,585,675 A | * | 12/1996 | Knopf ......................... 257/686 |
| 5,611,696 A | * | 3/1997 | Donner et al. ................. 439/66 |
| 5,770,476 A | * | 6/1998 | Stone .......................... 438/106 |
| 5,781,413 A | | 7/1998 | Howell et al. .............. 361/777 |
| 5,800,184 A | * | 9/1998 | Lopergolo et al. ........... 439/591 |
| 5,926,029 A | | 7/1999 | Ference et al. ............. 324/762 |
| 5,953,214 A | * | 9/1999 | Dranchak et al. ........... 257/686 |
| 5,984,691 A | * | 11/1999 | Brodsky et al. .............. 439/66 |
| 6,191,487 B1 | * | 2/2001 | Rodenbeck et al. ........ 257/737 |
| 6,191,952 B1 | * | 2/2001 | Jimarez et al. ............. 361/771 |
| 6,245,175 B1 | * | 6/2001 | Hotta et al. ................. 156/172 |
| 6,271,483 B1 | * | 8/2001 | Horiuchi et al. ............. 174/265 |
| 6,332,782 B1 | * | 12/2001 | Bezama et al. ............... 439/66 |
| 2002/0046856 A1 | * | 4/2002 | Alcoe ......................... 174/52.1 |

FOREIGN PATENT DOCUMENTS

| | | | | |
|---|---|---|---|---|
| JP | 63307768 | | 6/1987 | ........... H01L/23/52 |
| JP | 63-52432 | * | 3/1988 | |
| JP | 04-24987 | * | 1/1992 | |
| JP | 06-181122 | * | 6/1994 | |

* cited by examiner

*Primary Examiner*—Evan Pert
(74) *Attorney, Agent, or Firm*—John A. Jordan; Arthur J. Samodovitz

(57) ABSTRACT

A flexible, compliant layer of a single low modulus material for connecting a chip die directly to a circuit card without encapsulation. The flexible compliant layer provides stress relief caused by CTE thermal mismatch in chip die and circuit card. An array of copper plated vias are formed in said compliant layer with each via terminating on opposing surfaces of the layer in copper pads. Rather than copper, other metals, such as gold or nickel, may also be used. An array of holes may be positioned between said array of vias to provide additional resiliency. The plated vias may be angled with respect to said opposing surfaces to allow additional vertical and horizontal stress relief. Connection of the pads on one surface to high melt C-4 solder balls or columns on a chip die results in solder filled vias. Low melt solder connection of the pads on the other surface to a circuit card allows non-destructive rework of the cards.

9 Claims, 2 Drawing Sheets

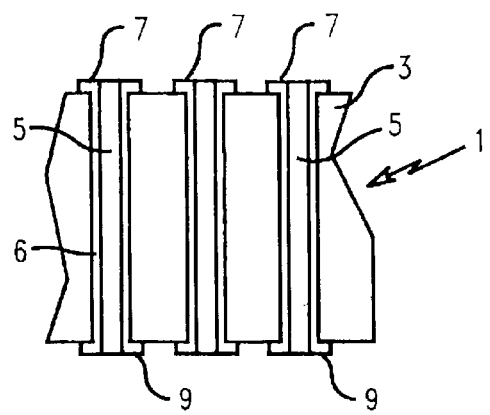
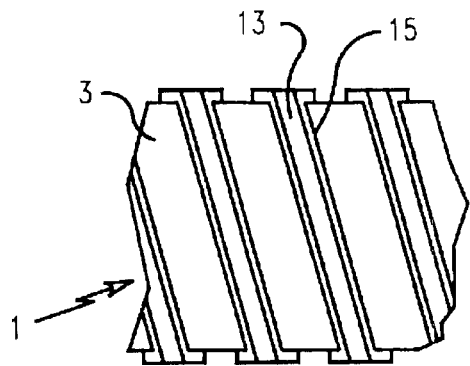
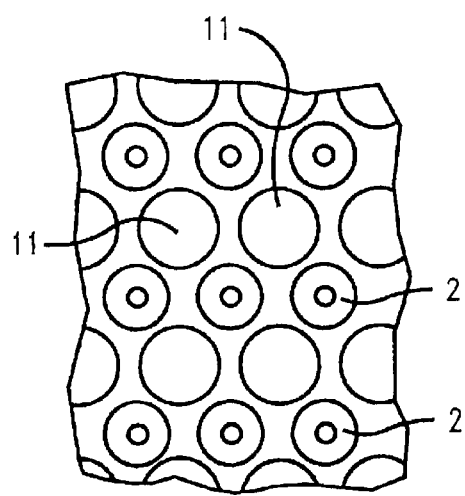
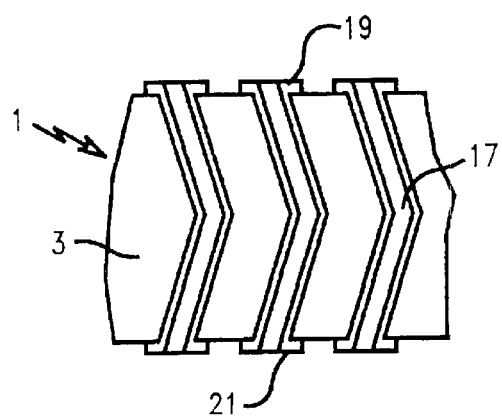
FIG. 1
FIG. 3
FIG. 2
FIG. 4

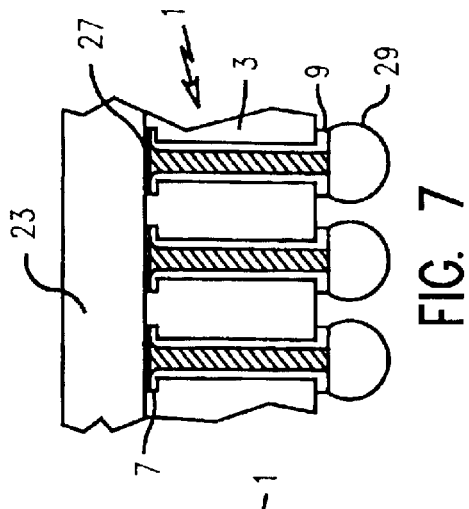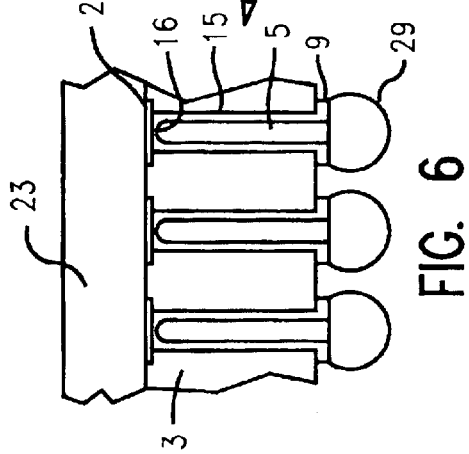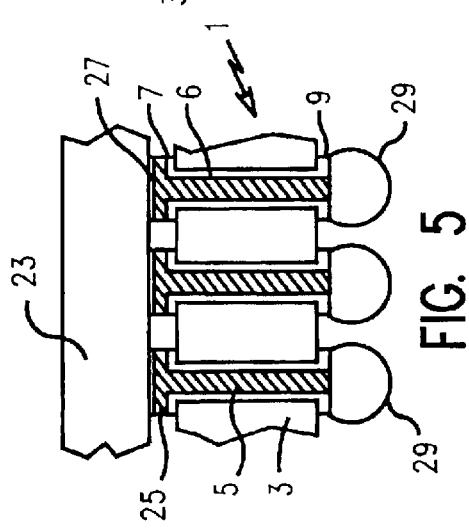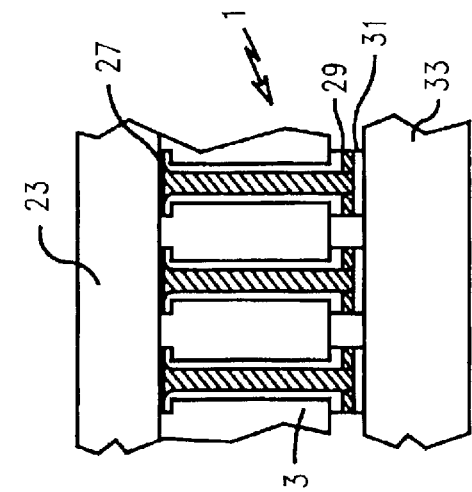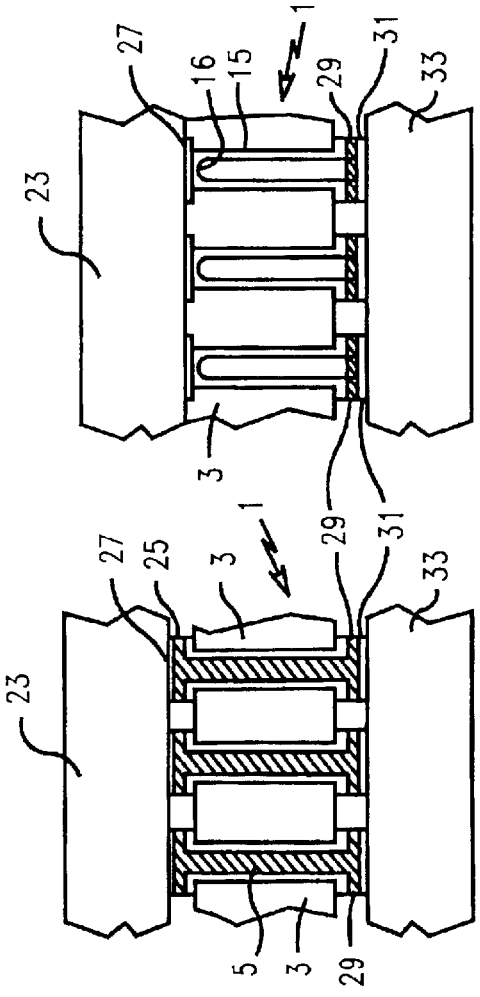

FLOATING INTERPOSER

BACKGROUND OF THE INVENTION

1. Field of the Invention

The present invention relates to an electrical interconnection arrangement for making connection between electronic devices and, more particularly, to making electrical connection between chip die and the next level of carrier.

2. Background and Related Art

One of the problems encountered with some semiconductor chip die connections to the next level of packaging is the high stress on the interconnections caused by coefficient of thermal expansion (CTE) mismatch. The CTE thermal mismatch is particularly large where the chip die is connected to laminate chip carriers made of material similar to an epoxy circuit board material. As circuit densities in chip dies increase, so does the heat generated by these dies thereby compounding the problem with larger temperature variations in its thermal cycle. In addition, certain applications, such as flip chip applications, have required encapsulation to ensure a reliable flip chip interconnection in the solder joints. Such encapsulation typically employs a high strength epoxy which acts to bond the chip die to the laminate chip carrier. This bonding of chip die to chip carrier reduces solder joint stress during thermal cycling but causes the chip die itself to be put under cyclical high internal stress eventually leading to chip cracking, delamination and device breakdown.

The above described high internal stresses on the chip die are generally attributed to the fact that the bonding of chip die to laminate chip carrier acts to cause this composite of materials to act like a "bimetallic" element wherein the composite bends upon heating due to the different CTE of the materials. As a result of the large thermal mismatch between the die and laminate chip carrier, the cyclical bending over time causes device failure. In this regard, the CTE for a typical chip die may be in the order of 3 micro inches per inch per degree Centigrade while a typical late chip carrier is around six times that amount. Thus, although the use of encapsulation is to prevent the C-4 connections from detaching from fatigue and fracturing over thermal cycling, the bonding action of the encapsulation in itself acts to cause the chips to fracture and separate from the chip carrier.

In general, others have attempted to address the problems caused by CTE mismatch of materials in IC packaging by providing various interposing structures that attempt to reduce the mismatch of CTE. For example, multiple layers of materials with varying CTEs may be employed to form an interposing layer between one level of packaging and the next, with the layers having a gradation of CTEs such that the layer contacting one level of packaging is selected to have a CTE which more closely matches the CTE of that level while the layer contacting the next level of packaging has a CTE more closely matching that level while layers between may gradually reduce the difference. In addition, efforts have also been made to use interposing layers which are flexible in nature such as to reduce the stress on electrical interconnections during thermal cycling created by thermal mismatch. However, these various efforts typically rely on single or multiple layers of material which are either costly to fabricate or difficult to assemble, and are not totally effective in their purpose. More often, these layers are between ceramic chip carriers and circuit board or card.

SUMMARY OF THE INVENTION

In accordance with the teachings of the present invention, internal stresses in chip dies and their electrical interconnection caused by encapsulation and bonding of chip dies to laminate chip carriers are overcome through the use of a floating interposer having an array of connectors extending therethrough and positioned between chip die contacts and circuit card contacts. The floating interposer acts as chip carrier and provides stress relief to the electrical interconnections between chip die and circuit card by moving on its opposing surfaces relative to the CTE rate of the material with which it is in contact.

The floating interposer of the present invention comprises a flexible and compliant layer of low modulus material having an array of vias plated with copper which vias terminate in copper pads at each end on opposing surfaces of the flexible layer. In addition, the flexible layer may have an array of relatively large holes arranged between the array of vias to produce a "swiss-cheese-like" structure to give more resilience.

In one fabrication process, when the plated vias of the interposer are aligned with C-4 solder balls on a flip chip die, upon heating the vias become filled with solder while becoming electrically connected to the chip die. The other ends of the vias are attached to the circuit card by a low melt solder. Alternatively, the flexible interposer may be copper plated directly against the BLM pads on the chip die.

Accordingly, it is an object of the present invention to provide an improved integrated circuit device package and method of making same.

It is another object of the present invention to provide improved electronic device interconnection and method of making same.

It is a further object of the present invention to provide improved electronic interconnection between chip die device and chip carrier.

It is yet a further object of the present invention to provide an improved electronic interconnection between chip die and chip carrier such as to reduce internal stress in both the chip die and the electrical interconnections between chip die and chip carrier.

It is still yet a further object of the present invention to provide a flexible interposer arrangement between chip die and chip carrier which allows the chip die to be connected to the chip carrier without encapsulation of the interconnection points.

It is another object of the present invention to provide a method and apparatus for making electrical interconnection between chip die directly to circuit card.

It is yet another object of the present invention to provide a compact, reworkable die solution.

These foregoing and other objects, features and advantages of the invention will be apparent from the following more particular description of a preferred embodiment of the invention, as illustrated in the accompanying drawings, wherein like reference members represent like parts of the invention.

BRIEF DESCRIPTION OF THE DRAWING

FIG. 1 shows a partial cross-section of one embodiment of the floating interposer structure of the present invention.

FIG. 2 shows a partial top view of a further refinement of the floating interposer of the present invention.

FIG. 3 shows a partial cross-section of another embodiment of the floating interposer structure of the present invention.

FIG. 4 shows a partial cross-section of yet a further embodiment of the floating interposer structure of the present invention.

FIG. 5 shows a partial cross-sectional view of one method and structure for connecting the floating interposer of the present invention to a chip die.

FIG. 6 shows a partial cross-sectional view of another method and structure for connecting the floating interposer of the present invention to a chip die.

FIG. 7 shows a partial cross-sectional view of a further method and structure for connecting the floating interposer of the present invention to a chip die.

FIG. 8 shows a partial cross-sectional view of a method and structure for further connecting the interposer arrangement of FIG. 5 to a circuit card.

FIG. 9 shows a partial cross-sectional view of a method and structure for further connecting the interposer arrangement of FIG. 6 to a circuit card.

FIG. 10 shows a partial cross-sectional view of a method and structure for further connecting the interposer arrangement of FIG. 7 to a circuit card.

DETAILED DESCRIPTION

With reference to FIG. 1, there is shown an interposer arrangement, in partial cross-section, fabricated in accordance with the present invention. Interposer 1 is fabricated from a flexible dielectric layer 3 of low modulus material such as, for example, Rogers 2800 material, Dow 1-4173 material or GE 3281 material. Layer 3 may have an elastic modulus in the range of about 50,000 psi to about 400,000 psi. The thickness of flexible dielectric layer 3 may range between 10 to 15 mils. This may be obtained by laminating several layers of Rogers 2800 material for example, with heat and pressure to form this thickness. An array of vias 5 are formed in the layer, each approximately 2 mils in diameter. These vias may be fabricated by laser ablation, for example. The array of vias are patterned to match the pattern of connection points on the flip chip die and corresponding connection points on the circuit card chip carrier to which it will be interposed and connected. The vias are then copper plated to form copper walls 6. This may be achieved by first plating all of layer 3 with electroless copper. A plating resist is then applied to the vias and both sides of the layer. A mask is aligned to retain resist in the vias and at sites surrounding the end of the vias so as to form top pads 7 and bottom pads 9 at the respective ends of the copper walls. Each pad may be approximately 4 mils in diameter. The resist is then exposed and developed and exposed copper on both sides removed after which the resist is stripped off. Further plating may then be carried out. For some applications, the copper plated vias could then be filled with a conductive adhesive composition, if necessary, but the arrangements shown in FIGS. 5 and 7 use a different approach.

It should be understood that although in the various embodiments described herein, reference is made to use of copper to form the walls and pads, it is clear that other metals, such as gold or nickel, may also be used in place of copper for plating the various vias and pads. The process for applying these metals is the same as that used for applying copper.

To further reduce stiffness in flexible dielectric layer 1 of FIG. 1 and make it more soft and spongy, additional holes 11 may be formed through the layer between the vias to form a "swiss-cheese-like" structure, as shown in FIG. 2. These holes may be 3 to 4 mils in diameter and may also be formed by laser ablation. As shown in FIG. 2, holes 11 are patterned in an array that compliments the array of vias 5, each hole being approximately equidistant the vias which surround it.

FIG. 3 shows a further interposer arrangement in accordance with the present invention. As can be seen, the difference between FIGS. 1 and 3 is that FIG. 3 shows angled or sloped vias 13 with copper plated walls 15 in flexible dielectric layer 3. These vias may also be made by laser ablation and plated as described with respect to FIG. 1. The advantage of the sloped plated vias is that this configuration provides additional freedom to flex both vertically and horizontally. Additional holes, as shown at 11 in FIG. 2, may also be fabricated between the vias in the flexible dielectric layer 3 of FIG. 3 at the same slope as these vias.

FIG. 4 shows yet a further interposer arrangement, in partial cross-section, in accordance with the present invention. As shown in FIG. 4, copper plated vias 17 are formed in a V-shape configuration in flexible dielectric layer 3. Again, the configuration allows for additional freedom to flex in both the vertical and horizontal directions but has the additional advantage of positioning pads 19 and 21 in vertical alignment with one another. As was described with respect to FIGS. 1 and 3, additional V-shaped holes 11 may be formed between the vias, as taught in FIG. 2.

FIG. 5 shows interposer 1 attached to chip die 23 by solder connections, shown by cross-hatching. The attachment of interposer 1, as shown in FIG. 1, to chip die 23 is achieved by positioning interposer pads 7 against conventional corresponding high melt (250–360° C.) C-4 solder bumps, previously attached to BLM pads 27 on chip die 23 in conventional manner. Upon heating, the high melt C-4 solder bumps collapse and solder is drawn through the respective copper plated vias 5 to copper pads 9 on the bottom surface of the interposer to form solder connectors. A solder stop layer may be temporarily positioned on the bottom surface of the interposer to limit the solder flow to the surface of pads 9. Thereafter the layer can be removed to expose pads 9. Alternatively, solder flow may be allowed to flow past the surface of pads 9 and, upon cooling, excess solder is trimmed flush with the surface pads.

Positioning interposer 1 in FIG. 5 against the high melt C-4 solder bumps on chip die 23 and heating the solder so that it is drawn through vias 5 acts to simply and effectively provide a means of electrically connecting chip die metallurgy to conductive pads 9 on the bottom surface of interposer 1, and this is achieved without damaging the underlying circuitry on the chip die. After cooling, conventional low melt (170–200° C.) solder balls 29 are attached to pads 9.

FIG. 6 shows another arrangement for attaching interposer 1 to chip die 23. In this arrangement, flexible dielectric layer 3 described in FIG. 1 is first laminated to the bottom of chip die 23 before any vias are formed. This may be done by placing the interposer and chip die in a lamination press and subjecting same, depending on materials, to heat (about 180–400° C.) and pressure (about 250–2000 psi) for at least 1 hour. Then, the interposer material is laser ablated to form vias through to the underside of chip die 23 to expose BLM pads 27. The assembly is then cleaned to remove any contamination on surfaces inside the holes and on the interposer surface and these surfaces are then subjected to electroless copper plating. It can be seen that here, copper deposits not only on via walls at 15 but also at the bottom of the vias at 16 on BLM pads 27. Unwanted copper is then removed using the process described with respect to FIG. 1, leaving copper at the bottom and side walls of the holes and at the interposer surface to form pads 9 around the holes. Thereafter, similar to FIG. 5, low melt solder balls 29 are attached to pads 9 on the bottom of integer 1.

FIG. 7 shows a further arrangement for attaching interposer 1 to chip die 23. In this arrangement, a small amount of high melt solder is first deposited upon BLM pads 27 of chip die 23. Then, the interposer with the copper plated vias, as fabricated in accordance with the steps described with regard to FIG. 1, is positioned so that the interposer copper pads 7 align in contact with the solder deposits upon BLM pads 27. Next, the lamination steps described with regard to FIG. 6 are employed to laminate the interposer 1 to chip die 23 whereby the high melt solder is drawn into the copper plated vias, similar to that described with respect to FIG. 5 whereby a solder connection is made between chip die and interposer in a laminated configuration.

It can be seen that in FIGS. 6 and 7, interposer 1 is uniformly laminated against the surface of chip die 23. This is a result of the fact that the interposer material is sufficiently soft and resilient that it conforms to the small surface protrusions of the chip die and interposer pads at the chip die-laminate interface. In this regard, typical pad configurations only extend from 0.0001 to 0.0003 inches above the surface upon which they are deposited. However, it should be understood that although the surfaces of the chip die and interposer are bonded to one another, the interposer material is sufficiently elastic to provide the overall stress relief required for the chip die and electrical interconnections to maintain their integrity notwithstanding the differences in CTE between chip die 23 and circuit card 33.

FIG. 8 shows the manner in which the solder connections 25, shown in cross-hatching, of FIG. 5 are attached to a circuit card. Low melt eutectic solder balls 29 in FIG. 5 are first aligned in contact with chip pads 31 on circuit card 33. Upon heating, the solder balls melt and after cooling become soldered to pads 31. The same process is used in FIGS. 9 and 10 to attach the interposer/chip die structure of FIGS. 6 and 7 to circuit card 33.

A significant advantage is achieved in using low melt solder balls to attach the chip die/interposer package to circuit card 33. In this regard, use of the low melt solder allows the chip die/interposer package to easily be removed from circuit card 33 in the event rework is required, and this is done without destroying the chip die/interposer package.

It should be understood that any of the interposer configurations shown in FIGS. 1, 3 and 4, with or without the holes shown in FIG. 2, may be used in the arrangements of FIGS. 5 through 10.

It should also be understood that although the arrangement in FIG. 5 uses solder to connect to the chip die, it is possible to use plated dendrites on an electrically conductive adhesive bumped chip. Dendrites offer a non-solder solution which may be less susceptible to fatigue.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. An interposer for compliantly connection a chip die directly to a circuit card comprising a layer of elastic dielectric material having an array of copper plated vias filled with solder extending from one surface of said dielectric material to the other with each of said copper plated vias terminating in a copper pad at said one and said other surface and with each of said copper plated vias similarly sloped with respect to said one and said other surface so as to allow said interposer to flex both vertically and horizontally, said layer of elastic dielectric material further having a uniformed array of holes extending therethough and arranged so that individual ones of said holes of said array of holes are positioned to be substantially surrounded by individual one of said array of copper plated vias so as to further facilitate uniform compliance of said interposer.

2. The interposer as set forth in claim 1, wherein said elastic dielectric material having an array of holes extending therethough positioned to be surrounded by individual cones of said array of copper plated vias are arranged with a slope substantially the same as the slope of said copper plated vias.

3. The interposer as set forth in claim 2 wherein said elastic dielectric material is 10 to 15 mils thick and has an elastic modulus in the range of 50,000 to 400,000 psi.

4. An electronic package comprising:
  a semiconductor chip die having an array of conductive pads on one surface thereof;
  a flexible layer of dielectric material having an array of metal plated vias extending therethough in similarly sloped relationship to opposing surfaces thereof with said metal plated vias of said array of metal plated vias formed by two segments each of which is sloped with respect to an opposing surface of said flexible layer of dielectric material to meet internal to said surfaces to form a V-shaped metal plated vial so as to thereby allow said layer of dielectric material to flex both vertically and horizontally and with each of said metal plated vias terminating in a metal pad on each of said opposing surfaces to form so array of pads thereon with respective ones of said metal pads on one of said opposing surfaces electrically connected to respective ones of said array of conductive pads on said chip die, said flexible layer of dielectric material having a uniform array of holes extending therethough arranged so that individual ones of said holes of said array of holes are positioned to be substantially surrounded by individual ones of said array of copper plated vias; and
  a circuit card having an array of conductive pads corresponding to said array of metal pads on the other of said opposing surfaces of said flexible layer of dielectric material with respective ones of said array of conductive pads on said circuit card electrically connected to respective ones of said array of metal pads on the said other of said opposing surfaces of said layer of dielectric material.

5. The electronic package of claim 4 wherein said array of metal plated vias each terminating in a metal pad on each of said opposing surfaces is an array of copper plated vias each terminating in a copper pad on each of said opposing surfaces.

6. The electronic package of claim 5 wherein respective ones of said copper pads on said one of said surfaces are connected to respective ones of said array of conductive pads on said chip die by a copper plated connection.

7. The electronic package claim 5 wherein said copper plated vias are filled with solder.

8. The electronic package of claim 4 wherein said flexible layer is a low elastic modulus material.

9. The electronic package of claim 4 wherein said flexible layer has an elastic modulus in the range of 50,000 to 400,000 psi.

* * * * *